(12) United States Patent
Rao et al.

(10) Patent No.: US 9,366,964 B2
(45) Date of Patent: Jun. 14, 2016

(54) COMPOSITIONS AND ANTIREFLECTIVE COATINGS FOR PHOTOLITHOGRAPHY

(75) Inventors: Yuanqiao Rao, Lake Jackson, TX (US); Robert L. Auger, Midland, MI (US); Cecilia W. Kiarie, Marlborough, MA (US); Yasmin N. Srivastava, Sugar Land, TX (US); Christopher P. Sullivan, Halifax, MA (US)

(73) Assignees: Dow Global Technologies LLC, Midland, MI (US); Rohm and Haas Electronic Materials LLC, Marlborough, MA (US)

( * ) Notice: Subject to any disclaimer, the term of this patent is extended or adjusted under 35 U.S.C. 154(b) by 747 days.

(21) Appl. No.: 13/596,324

(22) Filed: Aug. 28, 2012

(65) Prior Publication Data

US 2013/0071561 A1 Mar. 21, 2013

Related U.S. Application Data

(60) Provisional application No. 61/537,097, filed on Sep. 21, 2011.

(51) Int. Cl.
| | |
|---|---|
| *C09D 183/06* | (2006.01) |
| *G03F 7/09* | (2006.01) |
| *C08G 77/08* | (2006.01) |
| *G03F 7/075* | (2006.01) |
| *C08L 83/04* | (2006.01) |
| *C08G 77/14* | (2006.01) |
| *C08G 77/20* | (2006.01) |
| *C08G 77/00* | (2006.01) |

(52) U.S. Cl.
CPC ............... *G03F 7/091* (2013.01); *C08G 77/08* (2013.01); *C08L 83/04* (2013.01); *G03F 7/0751* (2013.01); *C08G 77/14* (2013.01); *C08G 77/20* (2013.01); *C08G 77/80* (2013.01)

(58) Field of Classification Search
CPC ................................. C08L 101/10; C07F 7/182
USPC ........................................................ 526/279
See application file for complete search history.

(56) References Cited

U.S. PATENT DOCUMENTS

| | | | |
|---|---|---|---|
| 5,399,601 A * | 3/1995 | Kusumi et al. ............... 524/188 |
| 5,621,034 A | 4/1997 | Mautner | |
| 6,268,457 B1 | 7/2001 | Kennedy et al. | |
| 6,824,879 B2 | 11/2004 | Baldwin et al. | |
| 7,303,785 B2 | 12/2007 | Ogihara et al. | |
| 7,385,021 B2 | 6/2008 | Hamada et al. | |
| 7,417,104 B2 | 8/2008 | Iwabuchi et al. | |
| 7,485,690 B2 | 2/2009 | Hamada et al. | |
| 7,655,377 B2 | 2/2010 | Matsuzawa et al. | |
| 7,767,747 B2 | 8/2010 | Lind et al. | |
| 7,855,043 B2 | 12/2010 | Ogihara et al. | |
| 7,868,407 B2 | 1/2011 | Ogihara et al. | |
| 7,875,417 B2 | 1/2011 | Ogihara et al. | |
| 8,178,159 B2 | 5/2012 | Baikerikar et al. | |
| 8,318,258 B2 | 11/2012 | Shirahata | |
| 9,011,591 B2 | 4/2015 | Rao et al. | |
| 9,068,086 B2 | 6/2015 | Evans et al. | |
| 2002/0095018 A1 | 7/2002 | Baldwin et al. | |
| 2004/0253461 A1 | 12/2004 | Ogihara et al. | |
| 2005/0014838 A1 | 1/2005 | Monroe et al. | |
| 2005/0274692 A1 | 12/2005 | Hamada et al. | |
| 2005/0277058 A1 | 12/2005 | Iwabuchi et al. | |
| 2005/0277755 A1 | 12/2005 | Hamada et al. | |
| 2005/0277756 A1 | 12/2005 | Iwabuchi et al. | |
| 2007/0185298 A1 | 8/2007 | Baikerikar et al. | |
| 2007/0238300 A1 | 10/2007 | Ogihara et al. | |

(Continued)

FOREIGN PATENT DOCUMENTS

| | | |
|---|---|---|
| EP | 2560049 A2 | 2/2013 |
| JP | 10 273623 | * 10/1998 |

(Continued)

OTHER PUBLICATIONS

JP 10 273623 machine translation (1998).*
Rao et al., Molecular Composites Comprising TiO2 and Their Optical Properties, Macromolecules, 2008, 41, 4838-4844.

*Primary Examiner* — Kuo-Liang Peng

(57) ABSTRACT

A composition comprising:
A) polymer that comprises:

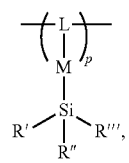

L is CX—CYZ, where X, Y, and Z are independently hydrogen, an alkyl, or a substituted alkyl; and, M is an alkylene, an arylene, a substituted alkylene, a substituted arylene, or C(O)O—W—, where W is an alkylene or a substituted alkylene; and R', R", and R'" are independently selected from an aromatic hydrocarbon, an aliphatic hydrocarbon, or a substituted hydrocarbon that comprises one or more of O, N, S, or Si atoms, provided that at least one of R', R", and R'" is selected from alkoxyl, aryloxyl, hydroxyl, halide, carboxyl, or carbonate; and, p is from 1 to 10,000; and the polymer does not comprise a polyhedral oligomeric silsesquioxane structure; and B) a polymer formed from a composition comprising at least one Si-containing compound as described herein. Compositions are suitable for microelectronic applications, and have improved adhesion to photoresists polymers.

17 Claims, 2 Drawing Sheets

(56) References Cited

U.S. PATENT DOCUMENTS

| | | |
|---|---|---|
| 2007/0298349 A1 | 12/2007 | Zhang et al. |
| 2009/0148789 A1 | 6/2009 | Amara et al. |
| 2010/0086872 A1 | 4/2010 | Ogihara et al. |
| 2010/0210765 A1 | 8/2010 | Nakajima et al. |
| 2010/0285407 A1 | 11/2010 | Ogihara et al. |

FOREIGN PATENT DOCUMENTS

| | | |
|---|---|---|
| JP | 2004 309560 A | 11/2004 |
| JP | 2004-354547 A | 12/2004 |
| WO | 03/044078 | 11/2002 |
| WO | 2009/095521 A1 | 8/2009 |
| WO | 2011/087767 A1 | 7/2011 |

* cited by examiner

COMPOSITIONS AND ANTIREFLECTIVE COATINGS FOR PHOTOLITHOGRAPHY

The present application claims the benefit of U.S. Provisional Application No. 61/537,097, filed on Sep. 21, 2011, fully incorporated herein by reference.

The present invention relates to compositions, and in particular, to antireflective coating compositions (for example, "BARCs"), for use in microelectronic applications. In the microelectronic industry there is a continual need for such compositions that have improved adhesion to photoresist polymers.

International Publication No. WO 2005/056682 discloses emulsion compositions containing a silicon polymer and an organic polymer. The organic polymer is formed by the free radical polymerization of one or more ethylenically unsaturated organic monomers, such as an acrylate ester, a methylacrylate, a fluorinated acrylate, a fluorinated methacrylate, an acrylic acid, a methacrylic acid, an allyl methacrylate, a dimethylaminoethyl methacrylate, a vinyl halide, a vinyl ester, a vinyl aromatic compound, a vinyl ester of a monocarboxylic acid, or a vinyl pyrrolidone.

International Publication No. WO 2009/095521 discloses the incorporation of silsesquioxane into a copolymer, using monomers that have a variable (1 to 12) number of polymerizable double bonds per silsesquioxane molecule. The linear crosslinked copolymer is disclosed as having excellent optical properties and high levels of photostability.

Japanese patent reference JP 2004-309560 discloses an antireflective film for lithography, containing a polymer having a trialkylsilyl structure or a trialkoxysilyl structure, and a crosslinking agent.

Japanese patent reference JP 04-214385 discloses a light shielding film for packing material for photosensitive materials. The film comprises a blend consisting (A) 55-65 parts weight of a straight-chain, low density PE having a "2.0-3.0 g/10 minutes" melt flow rate, and a "0.910-0.920 g/cm$^3$" density; (B) 35-45 parts weight of a high density PE having a "0.03-0.05 g/10 minutes" melt flow rate, and a "0.940-0.956 g/cm$^3$" density; and (C) 2-10 parts weight of carbon black.

Japanese patent reference JP 2004-354547 discloses a material disclosed as having excellent optical characteristics, heat-resisting and moldability. The material comprises a "ladder-type" polysilsesquioxane.

U.S. Pat. No. 7,855,043 discloses a silicon-containing film, formed from a heat curable composition comprising the following: (A-1) a silicon-containing compound obtained by the hydrolytic condensation of a hydrolyzable silicon compound in the presence of an acid catalyst, (A-2) a silicon-containing compound obtained by the hydrolytic condensation of a hydrolyzable silicon compound in the presence of a basic catalyst, (B) a hydroxide or organic acid salt of lithium, sodium, potassium, rubidium or cesium, or a sulfonium, iodonium or ammonium compound, (C) an organic acid, and (D) an organic solvent. The silicon-containing film is disclosed as allowing the effective patterning of an overlying photoresist film.

U.S. Pat. No. 7,875,417 discloses a silicon-containing film, formed from a heat curable composition comprising the following: (A-1) a silicon-containing compound obtained through the hydrolytic condensation of a hydrolyzable silicon compound in the presence of an acid catalyst, (A-2) a silicon-containing compound obtained through the hydrolytic condensation of a hydrolyzable silicon compound in the presence of a base catalyst, (B) a hydroxide or organic acid salt of Li, Na, K, Rb or Ce, or a sulfonium, iodonium or ammonium compound, (C) an organic acid, (D) a cyclic ether-substituted alcohol, and (E) an organic solvent. The silicon-containing film is disclosed as ensuring the effective pattern formation on a substrate, the effective transfer of a photoresist pattern, and the accurate processing of a substrate.

U.S. Pat. No. 7,868,407 discloses a substrate comprising at least an organic film, an antireflection silicone resin film over the organic film, and a photoresist film over the antireflection silicone resin film. The antireflection silicone resin film includes a lower silicone resin film and an upper silicone resin film, which has lower silicon content than the lower silicone resin film.

Additional compositions for antireflective films and/or other electronic applications are disclosed in the following references: U.S. Pat. Nos. 5,621,034, 6,268,457, 6,824,879, 7,385,021, 7,417,104, 7,485,690 and 7655377; US Publication Nos. 2004/0253461, 2005/0277756, 2005/0277755, 2005/0277058, 2005/0274692, 2005/0148380, 2007/0238300, 2007/0298349, 2007/0298349, 2007/0185298, 2009/0148789, 2010/0086872, 2010/0285407 and U.S. Publication 2010/0210765; EP 1845132A2; EP 1614151B1; WO 2007/148223; WO 2009/088600; and Rao et al., *Molecular Composites Comprising TiO$_2$ and Their Optical Properties*, Macromolecules, 2008, 41, 4838-4844.

As discussed, there remains a need for compositions for use as antireflective layer compositions, and which have improved adhesion to photoresists polymers. There is a further need for cost-effective compositions that can be formed into antireflective layers using a spin coating process. These needs and others have been met by the following invention.

SUMMARY OF INVENTION

The invention provides a composition comprising at least the following A and B:

A) polymer that comprises the following structural unit 1:

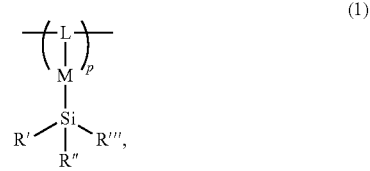

wherein

L is CX—CYZ, where X, Y, and Z are each independently selected from hydrogen, an alkyl, or a substituted alkyl; and, M is an alkylene, an arylene, a substituted alkylene, a substituted arylene, or C(O)O—W—, where W is an alkylene or a substituted alkylene; and R', R", and R''' are each independently selected from an aromatic hydrocarbon, an aliphatic hydrocarbon, or a substituted hydrocarbon that comprises one or more of O, N, S, or Si atoms, provided that at least one of R', R", and R''' is selected from alkoxyl, aryloxyl, hydroxyl, halide, carboxyl, or carbonate; and, p is an integer from 1 to 10,000; and with the proviso that the polymer does not comprise a polyhedral oligomeric silsesquioxane (POSS) structure; and B) a polymer formed from a first composition comprising at least one of the following:

a) a Compound F1 selected from Formula 1:

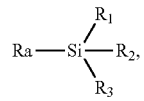

(Formula 1)

wherein Ra comprises one or more multiple bonds, provided that, if Ra comprises more than one multiple bond, these multiple bonds are not in a conjugated configuration; and R1, R2, and R3 are each independently selected from alkoxyl, hydroxyl, halide, OC(O)R, or OC(O)OR, wherein R is alkyl or a substituted alkyl;

b) a Compound F2 selected from Formula 2:

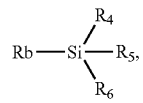

(Formula 2)

wherein Rb is selected from H or a saturated group comprising alkyl, alkylene, or alkylidene; and R4, R5, and R6 are each independently selected from alkoxyl, hydroxyl, halide, OC(O)R, or OC(O)OR, wherein R is alkyl or a substituted alkyl;

c) a Compound F3 selected from Formula 3:

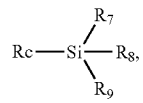

(Formula 3)

wherein Rc comprises more than one multiple bond, and these multiple bonds are in a conjugated configuration; and R7, R8, and R9 are each independently selected from alkoxyl, hydroxyl, halide, OC(O)R, or OC(O)OR, wherein R is alkyl or a substituted alkyl; and/or d) A Compound F4 selected from Formula 4:

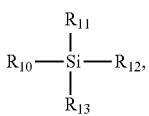

(Formula 4)

wherein R10, R11, R12, and R13 are each independently selected from alkoxyl, hydroxyl, halide, OC(O)R, or OC(O)OR, wherein R is alkyl or a substituted alkyl.

DETAILED DESCRIPTION

Figure 1:
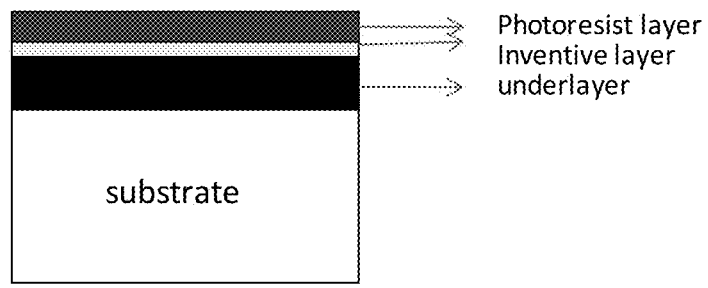
FIG. 1 depicts a schematic of a tri-layer film structure over a silicon wafer.

As discussed above, the invention provides a composition comprising at least the following A and B:

A) polymer that comprises the following structural unit 1:

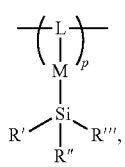

(1)

wherein

L is CX—CYZ, where X, Y, and Z are each independently selected from hydrogen, an alkyl, or a substituted alkyl; and, M is an alkylene, an arylene, a substituted alkylene, a substituted arylene, or C(O)O—W—, where W is an alkylene or a substituted alkylene; and R', R", and R'" are each independently selected from an aromatic hydrocarbon, an aliphatic hydrocarbon, or a substituted hydrocarbon that comprises one or more of O, N, S, or Si atoms, provided that at least one of R', R", and R'" is selected from alkoxyl, aryloxyl, hydroxyl, halide, carboxyl, or carbonate; and, p is an integer from 1 to 10,000; and with the proviso that the polymer does not comprise a polyhedral oligomeric silsesquioxane (POSS) structure; and B) a polymer formed from a first composition comprising at least one of the following:

a) a Compound F1 selected from Formula 1:

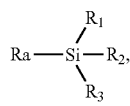

(Formula 1)

wherein Ra comprises one or more multiple bonds, provided that, if Ra comprises more than one multiple bond, these multiple bonds are not in a conjugated configuration; and R1, R2, and R3 are each independently selected from alkoxyl, hydroxyl, halide, OC(O)R, or OC(O)OR, wherein R is alkyl or a substituted alkyl;

b) a Compound F2 selected from Formula 2:

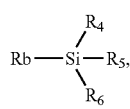

(Formula 2)

wherein Rb is selected from H or a saturated group comprising alkyl, alkylene, or alkylidene; and R4, R5, and R6 are each independently selected from alkoxyl, hydroxyl, halide, OC(O)R, or OC(O)OR, wherein R is alkyl or a substituted alkyl;

c) a Compound F3 selected from Formula 3:

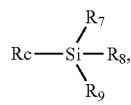

(Formula 3)

wherein Rc comprises more than one multiple bond, and these multiple bonds are in a conjugated configuration; and R7, R8, and R9 are each independently selected from alkoxyl, hydroxyl, halide, OC(O)R, or OC(O)OR, wherein R is alkyl or a substituted alkyl; and/or d) A Compound F4 selected from Formula 4:

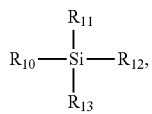

(Formula 4)

wherein R10, R11, R12, and R13 are each independently selected from alkoxyl, hydroxyl, halide, OC(O)R, or OC(O)OR, wherein R is alkyl or a substituted alkyl.

The inventive composition may comprise a combination of two or more embodiments as described herein.

In one embodiment, the polymer of Component B is formed from a first composition comprising a), b), c) and d).

In one embodiment, the polymer of Component B is formed from a first composition comprising the following: a), b), and c); or a), c) and d); or b), c) and d).

In one embodiment, the polymer of Component B is formed from a first composition comprising the following: a) and b); or a) and c); or a) and d); or b) and c); or b) and d); or c) and d).

In one embodiment, the polymer of Component B is formed from a first composition comprising the following: a); or b); or c); or d).

In one embodiment, in structural unit (1), X, Y, and Z are each independently selected from hydrogen or a C1-C10 alkyl group, or a C1-C6 alkyl group, or a C1-C3 alkyl group.

In one embodiment, in structural unit (1), M is a C1 to C10 alkylene, a C1 to C10 arylene, or a C(O)O—W—, and W is a C1 to C10 alkylene group.

In one embodiment, in structural unit (1), R', R", and R''' are each independently selected from a C1 to C10 aliphatic hydrocarbon, a C1 to C10 aromatic hydrocarbon, OH, OR, OC(O)R, or OC(O)OR, where R is a C1 to C10 aliphatic hydrocarbon, or a C1 to C10 aromatic hydrocarbon, provided that at least one of R', R", and R''' is OH, OR, OC(O)R, or OC(O)OR.

In one embodiment, in structural unit (1), X, Y, and Z are each independently selected from hydrogen, or a C1 to C10 alkyl group; and M is a C1 to C10 alkylene, a C1 to C10 arylene, or a C(O)O—W—, and W is a C1 to C10 alkylene group; and R', R", and R''' are each independently selected from a C1 to C10 aliphatic hydrocarbon, a C1 to C10 aromatic hydrocarbon, OH, OR, OC(O)R, or OC(O)OR, where R is a C1 to C10 aliphatic hydrocarbon, or a C1 to C10 aromatic hydrocarbon, provided that at least one of R', R", and R''' is OH, OR, OC(O)R, or OC(O)OR; and p is an integer from 10 to 1000.

In one embodiment, in structural unit (1), X, Y, and Z are each independently selected from hydrogen or a methyl group; and M is phenylene or C(O)O—W—, and W is a C1 to C4 alkylene group; and R', R", and R''' are each independently selected from OH, OR, OC(O)R, or OC(O)OR, where R is a methyl, ethyl, n-propyl, 2-propyl, n-butyl, isobutyl, or 2-butyl; and p is an integer from 10 to 500.

In one embodiment, structural unit (1) has the following structure:

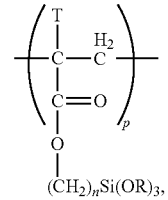

where T is H or methyl; R is methyl or ethyl; n is an integer from 1 to 3; and p is an integer from 10 to 500.

In one embodiment, structural unit (1) is a polymerized "3-acryloxypropyltrimethoxy-silane" unit.

In one embodiment, polymer of composition A is poly(3-acryloxypropyltrimethoxysilane).

In one embodiment, the polymer of component A has an Mw from about 10,000 to about 100,000.

The polymer of component A (polymer A) may comprise a combination of two or more embodiments as described herein.

In one embodiment, the first composition comprises F1, F2, F3 and F4, and comprises greater than, or equal to, 5 weight percent Si, or greater than, or equal to, 10 weight percent Si, or greater than, or equal to, 15 weight percent Si, based on the sum weight of Compounds F1, F2, F3 and F4.

In one embodiment, the first composition comprises F1, F2, F3 and F4, and the sum molar amount of Compound F2 and Compound F4 is greater than, or equal to, 40 mole percent, based on the sum moles of Compounds F1, F2, F3 and F4.

In one embodiment, the first composition comprises F1, F2, F3 and F4, and Compound F4 is present in an amount greater than 10 mole percent, based on the sum moles of Compounds F1, F2, F3 and F4.

In one embodiment, the first composition comprises F1, F2, F3 and F4, and the molar ratio of F1/F4 is from 1/20 to 1/1, or from 1/15 to 1/1, or from 1/10 to 1/1.

In one embodiment, the first composition comprises F1, F2, F3 and F4, and F1 ranges from 5 to 50 weight percent, or from 10 to 30 weight percent; F2 ranges from 5 to 50 weight percent, or from 10 to 40 weight percent; F3 ranges from 2 to 20 weight percent, or from 2 to 10 weight percent; F4 ranges from 20 to 80 weight percent, or from 30 to 80 weight percent. Each weight percentage is based on the weight of the first composition.

In one embodiment, for the first composition, Compound F1 is present in an amount from 10 to 90 mole percent, further from 15 to 90 mole percent, further from 20 to 90 mole percent, and further from 25 to 90 mole percent, based on the sum moles of Compounds F1, F2, F3 and F4.

In one embodiment, for the first composition, Compound F1 is present in an amount greater than 10 mole percent, further greater than 12 mole percent, based on the sum moles of Compounds F1, F2, F3 and F4.

In one embodiment, for the first composition, Compound F4 is present in an amount from 10 to 65 mole percent, further from 10 to 60 mole percent, further from 10 to 55 mole percent, and further from 10 to 50 mole percent, based on the sum moles of Compounds F1, F2, F3 and F4.

In one embodiment, for the first composition, Compound F4 is present in an amount less than 65 mole percent, further less than 60 mole percent, based on the sum moles of Compounds F1, F2, F3 and F4.

The first composition may comprise a combination of two or more embodiments as described herein.

An inventive composition may comprise a combination of two or more embodiments as described herein.

The invention also provides an article comprising at least one component formed from an inventive composition.

The invention also provides a film comprising at least one layer formed from an inventive composition.

In one embodiment, the film further comprises a second layer formed from a second composition comprising a polymer.

The invention also provides a film comprising at least two layers, and wherein at least one layer is an anti-reflective layer formed from an inventive composition. In a further embodiment, the other layer is a photoresist layer.

An inventive article may comprise a combination of two or more embodiments as described herein.

An inventive film may comprise a combination of two or more embodiments as described herein.

The invention also provides a method of forming a coating on a substrate, said method comprising at least the following:
providing a substrate;
forming an underlayer on the substrate, wherein the underlayer comprises at least one polymer;
applying an inventive composition over the underlayer; and
curing the composition to form the coating.

In a further embodiment, the method comprises applying at least one composition, which comprises at least one photoresist polymer, over the coating.

In one embodiment, multiple layers of the composition are applied over the underlayer.

In one embodiment, the coating is an antireflective layer.

The invention also provides a method of forming a coating on a substrate, said method comprising at least the following:
providing a substrate;
applying an inventive composition as a coating over at least a portion of the substrate, or over one or more intermediate layers applied over said substrate; and
curing the composition to form the coating.

In a further embodiment, the method comprises applying at least one composition, which comprises at least one photoresist polymer, over the coating.

In one embodiment, multiple layers of the composition are applied over at least a portion of the substrate, or over one or more intermediate layers applied over said substrate.

In one embodiment, the coating is an antireflective layer.

An inventive method may comprise a combination of two or more embodiments as described herein.

It has been discovered that the inventive compositions form strong interaction with photoresist polymers. It has also been discovered, that the inventive compositions can be used as adhesion promoting compositions in the formation coatings, for example, bi-layer or tri-layer coatings, on silicon wafers.

Polymer of Component A

The polymer of Component A comprises the following structural unit 1:

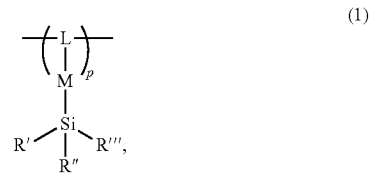

wherein

L is CX—CYZ, where X, Y, and Z are each independently selected from hydrogen, an alkyl, or a substituted alkyl; and, M is an alkylene, an arylene, a substituted alkylene, a substituted arylene, or C(O)O—W—, where W is an alkylene or a substituted alkylene; and R', R", and R'" are each independently selected from an aromatic hydrocarbon, an aliphatic hydrocarbon, or a substituted hydrocarbon that comprises one or more of O, N, S, or Si atoms, provided that at least one of R', R", and R'" is selected from alkoxyl, aryloxyl, hydroxyl, halide, carboxyl, or carbonate; and, p is an integer from 1 to 10,000; and with the proviso that the polymer does not comprise a polyhedral oligomeric silsesquioxane (POSS) structure.

A polyhedral oligomeric silsesquioxane (POSS) structure is shown below from two different views. In the POSS structure, the R group may be alkyl, substituted alkyl, aryl, or substituted aryl. A POSS structure can be connected to a polymer through one of the "R" groups. However, the polymer of Component A does not comprise a POSS structure.

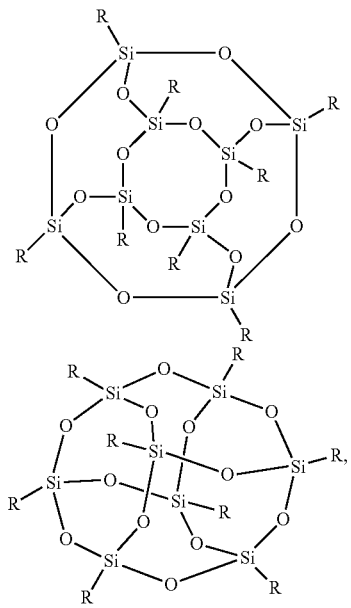

In one embodiment, polymer of component A is a homopolymer.

In one embodiment, polymer of component A is an interpolymer. In a further embodiment, the interpolymer comprises, in polymerized form, at least one comonomer selected from acrylates (for example, acrylate or methacrylate), vinyls (for example, styrene, para-hydroxystyrene), cyclic lactones, or combinations thereof. In a further embodiment, the comonomer is present in an amount from 2 to 15 mole percent, or 5 to 10 mole percent, based on total moles of polymerized monomers in the interpolymer.

In one embodiment, polymer of component A is a copolymer. In a further embodiment, the copolymer comprises, in polymerized form, at least one comonomer selected from acrylates (for example, acrylate or methacrylate), vinyls (for example, styrene, para-hydroxystyrene), or cyclic lactones. In a further embodiment, the comonomer is present in an amount from 2 to 15 mole percent, or 5 to 10 mole percent, based on total moles of polymerized monomers in the copolymer.

In one embodiment, polymer of component A is a homopolymer comprising, in polymerized form, the following structural unit:

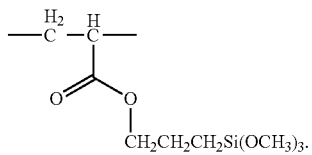

In one embodiment, polymer of component A is an interpolymer, comprising, in polymerized form, the following structural unit:

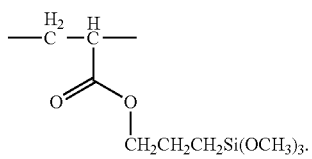

In a further embodiment, the interpolymer comprises, in polymerized form, at least one comonomer selected from acrylates (for example, acrylate or methacrylate), vinyls (for example, styrene, para-hydroxystyrene), cyclic lactones, or combinations thereof. In a further embodiment, the comonomer is present in an amount from 2 to 15 mole percent, or 5 to 10 mole percent, based on total moles of polymerized monomers in the interpolymer.

In one embodiment, polymer of component A is a copolymer, comprising, in polymerized form, the following structural unit:

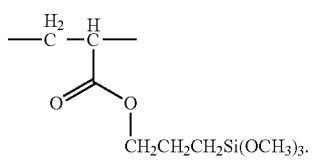

In a further embodiment, the copolymer comprises, in polymerized form, at least one comonomer selected from acrylates (for example, acrylate or methacrylate), vinyls (for example, styrene, para-hydroxystyrene), or cyclic lactones. In a further embodiment, the comonomer is present in an amount from 2 to 15 mole percent, or 5 to 10 mole percent, based on total moles of polymerized monomers in the copolymer.

The polymer of component A may comprise a combination of two or more embodiments as described herein.

Compounds F1-F4

Compounds F1, F2, F3 and F4 are described below.

a) Compound F1 is selected from Formula 1:

(Formula 1)

wherein Ra comprises one or more multiple bonds, including $C=C$, $C\equiv C$, $C=O$, $C=N$, and $C\equiv N$, provided that, if Ra comprises more than one multiple bond, these multiple bonds are not in a conjugated configuration; and R1, R2, and R3 are each independently selected from alkoxyl, hydroxyl, halide, OC(O)R, or OC(O)OR, wherein R is an alkyl or a substituted alkyl. In a further embodiment, R is alkyl.

In one embodiment, Ra comprises one or more of an alkenyl group, an alkynyl group, an imide, a nitrile, a ketone, an ester, an amide, or a carbonate, and it comprises from 2 to 10 carbon atoms; and R1, R2, and R3 are each independently selected from OH, OR, or OC(O)R, wherein R is a $C_1$-$C_{10}$ alkyl or a $C_1$-$C_{10}$ substituted alkyl.

In one embodiment, Ra comprises one or more of an alkenyl group, an alkynyl group, an imide, a nitrile, a ketone, an ester, an amide, or a carbonate, and it comprises from 2 to 10 carbon atoms; and R1, R2, and R3 are each independently selected from OH, OR, or OC(O)R, wherein R is a $C_1$-$C_{10}$ alkyl.

In one embodiment, Ra is selected from vinyl, allyl, propenyl, butenyl, acetoxyl, cyanoethyl, acetoethyl, or acetamidopropyl; and, R1, R2, and R3 are each OR, wherein each R independently is selected from methyl, ethyl, n-propyl, 2-propyl, n-butyl, isobutyl, or 2-butyl.

In one embodiment, Compound F1 is selected from vinyltrimethoxysilane or vinyltriethoxysilane.

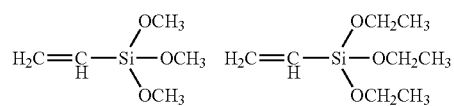

b) Compound F2 is selected from Formula 2:

(Formula 2)

wherein Rb is selected from H or a saturated group comprising alkyl, alkylene, or alkylidene; and, R4, R5, and R6 are each independently selected from alkoxyl, hydroxyl, halide, OC(O)R, or OC(O)OR, wherein R is an alkyl or a substituted alkyl. In a further embodiment, R is an alkyl.

In one embodiment, Rb is a saturated group comprising a substituted $C_1$-$C_{10}$ cyclic alkyl, a substituted acyclic alkyl, a substituted $C_1$-$C_{10}$ cyclic alkylene, a substituted $C_1$-$C_{10}$ acyclic alkylene, a substituted $C_1$-$C_{10}$ cyclic alkylidene, a substituted $C_1$-$C_{10}$ acyclic alkylidene, or H; or an unsubstituted $C_1$-$C_{10}$ cyclic alkyl, an unsubstituted $C_1$-$C_{10}$ acyclic alkyl, an unsubstituted $C_1$-$C_{10}$ cyclic alkylene, an unsubstituted $C_1$-$C_{10}$ acyclic alkylene, an unsubstituted $C_1$-$C_{10}$ cyclic alkylidene, or an unsubstituted $C_1$-$C_{10}$ acyclic alkylidene; and R4, R5, and R6 are each independently selected from OH, OR, or OC(O)R, wherein R is a $C_1$-$C_{10}$ alkyl or a $C_1$-$C_{10}$ substituted alkyl. In a further embodiment, R is a $C_1$-$C_{10}$ alkyl.

In one embodiment, Rb is a saturated group comprising an unsubstituted $C_1$-$C_{10}$ cyclic alkyl, an unsubstituted $C_1$-$C_{10}$ acyclic alkyl, an unsubstituted $C_1$-$C_{10}$ cyclic alkylene, an unsubstituted $C_1$-$C_{10}$ acyclic alkylene, an unsubstituted $C_1$-$C_{10}$ cyclic alkylidene, an unsubstituted $C_1$-$C_{10}$ acyclic alkylidene, or H; and R4, R5, and R6 are each independently selected from OH, OR, or OC(O)R, wherein R is a $C_1$-$C_{10}$ alkyl or a $C_1$-$C_{10}$ substituted alkyl. In a further embodiment, R is a $C_1$-$C_{10}$ alkyl.

In one embodiment, Rb is selected from methyl, ethyl, n-propyl, 2-propyl, n-butyl, isobutyl, or 2-butyl; and R4, R5, and R6 are each OR, wherein each R independently is selected from methyl, ethyl, n-propyl, 2-propyl, n-butyl, isobutyl, or 2-butyl.

In one embodiment, Compound F2 is selected from methyltrimethoxysilane or methyltriethoxysilane.

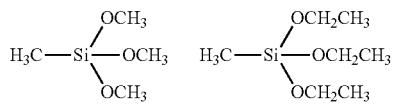

c) Compound F3 is selected from Formula 3:

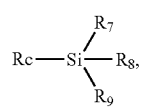

(Formula 3)

wherein Rc comprises more than one multiple bond, including C=C, C≡C, C=O, C=N, and C≡N, and these multiple bonds are in a conjugated configuration; and R7, R8, and R9 are each independently selected from alkoxyl, hydroxyl, halide, OC(O)R, or OC(O)OR, wherein R is an alkyl or a substituted alkyl. In a further embodiment, R is an alkyl.

In one embodiment, Rc comprises an aryl or substituted aryl, a conjugated diene or conjugated triene, a conjugated diketone, a conjugated keto-ester, an α,β-unsaturated ester, an α,β-unsaturated ketone, a nitrile in conjugation with an alkene, a nitrile in conjugation with an ketone, a nitrile in conjugation with an ester, an alkyne in conjugation with an alkene, an alkyne in conjugation with an ketone, or an alkyne in conjugation with an ester; and R7, R8, and R9 are each independently selected from OH, OR, or OC(O)R, wherein R is a $C_1$-$C_{10}$ alkyl or a $C_1$-$C_{10}$ substituted alkyl. In a further embodiment, R is a $C_1$-$C_{10}$ alkyl.

In one embodiment, Rc comprises a phenyl group, a naphthyl group, an anthracene group, a phenanthrene group, a fluorene group, a pyridine group, a quinoline group, an imidazole group, a benzoimidazole group, an indole group, a carbazole group, a furan group, a benzofuran group, a dibenzofuran group, an acryloxyl group, an acrylamido group, a methacryloxyl group, or a methacrylamido group; and R7, R8, and R9 are each OR, wherein each R independently is selected from methyl, ethyl, n-propyl, 2-propyl, n-butyl, isobutyl, or 2-butyl.

In one embodiment, Compound F3 is selected from phenyltrimethoxysilane or phenyltriethoxysilane.

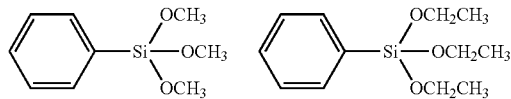

d) Compound F4 is selected from Formula 4:

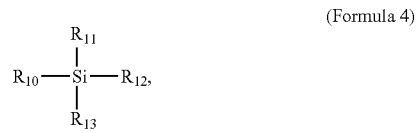

(Formula 4)

wherein R10, R11, R12, and R13 are each independently selected from alkoxyl, hydroxyl, halide, OC(O)R, or OC(O)OR, wherein R is an alkyl or a substituted alkyl. In a further embodiment, R is an alkyl.

In one embodiment, R10, R11, R12, and R13 are each independently selected from OH, OR, or OC(O)R, wherein R is a $C_1$-$C_{10}$ alkyl or a $C_1$-$C_{10}$ substituted alkyl. In a further embodiment, R is a $C_1$-$C_{10}$ alkyl.

In one embodiment, R10, R11, R12, and R13 are OR, wherein each R independently is selected from methyl, ethyl, n-propyl, 2-propyl, n-butyl, isobutyl, or 2-butyl.

In one embodiment, Compound F4 is selected from tetramethyl orthosilicate or tetraethyl orthosilicate:

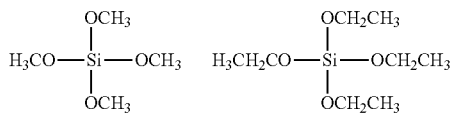

Tri-Layer Coatings

Tri-layer coatings, for example, tri-layer resists, typically comprise: (a) a curable underlayer composition on a substrate; (b) a hardmask composition (for example, a hardmask layer formed from an inventive composition described herein) applied above the curable composition; and (c) a photoresist composition layer applied above the hard mask composition. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed. Coating compositions and lithographic processes are described in U.S. Publication 2007/0238052 and U.S. Publication 2009/0148789, each incorporated herein by reference.

A variety of photoresists may be used in combination (i.e., overcoated) with an inventive coating composition of the present invention. Preferred photoresists include chemically-amplified resists, especially positive-acting or negative-acting photoresists that contain one or more photoacid generator compounds and a resin component that contains units that undergo a deblocking or cleavage reaction in the presence of photogenerated acid, such as photoacid-labile ester, acetal, ketal or ether units.

Negative-acting photoresists also can be employed with coating compositions of the invention, such as resists that crosslink (i.e., cure or harden) upon exposure to activating radiation. Preferred photoresists for use with a coating composition of the invention may be imaged with relatively short-wavelength radiation, e.g., radiation having a wavelength of less than 300 nm, or less than 260 nm, such as about 248 nm, or radiation having a wavelength of less than about 200 nm, such as 193 nm.

Suitable photoresists contain an imaging-effective amount of photoacid generator compounds and one or more resins. Suitable resins, include, but are not limited to, i) phenolic resin that contains acid-labile groups (for example, see U.S. Pat. Nos. 6,042,997 and 5,492,793); ii) polymers that contain polymerized units of a vinylphenol, an optionally substituted vinylphenyl (e.g., styrene) that does not contain a hydroxyl or carboxyl ring substituent, and an alkyl acrylate such as those deblocking groups described with polymers i) above, such as polymers described in U.S. Pat. No. 6,042,997; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526.

Additional resins include resins that are substantially or completely free of phenyl or other aromatic groups, and that can provide a chemically amplified resist particularly suitable for imaging at sub-200 nm wavelengths such as 193 nm. Preferred resins of this class include: i) polymers that contain polymerized units of a non-aromatic cyclic olefin (endocyclic double bond) such as an optionally-substituted norbornene, such as polymers described in U.S. Pat. Nos. 5,843,624, and 6,048,664; ii) polymers that contain alkyl acrylate units, such as e.g. t-butyl acrylate, t-butyl methacrylate, methyladamantyl acrylate, methyladamantyl methacrylate, and other acyclic alkyl and alicyclic acrylates; such polymers have been described in U.S. Pat. No. 6,057,083; European Published Applications EP01008913A1 and EP00930542A1, and iii) polymers that contain polymerized anhydride units, particularly polymerized maleic anhydride and/or itaconic anhydride units, such as disclosed in European Published Application EP01008913A1 and U.S. Pat. No. 6,048,662.

Other resins include resins that contain repeat units that contain a heteroatom, particularly oxygen and/or sulfur (but other than an anhydride, i.e. the unit does not contain a carbonyl ring atom), and preferably is substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit, such as provided by polymerization of a maleic anhydride or itaconic anhydride. Also, resins that contain fluorine substitution (fluoropolymer), for example, as may be provided by polymerization of tetrafluoroethylene, a fluorinated aromatic group, such as fluorostyrene compound, and the like.

Definitions

The term "composition," as used herein, includes a mixture of materials which comprise the composition, as well as reaction products and decomposition products formed from the materials of the composition.

The term "polymer," as used herein, refers to a polymeric compound prepared by polymerizing monomers, whether of the same or a different type. The generic term polymer thus embraces the term homopolymer (employed to refer to polymers prepared from only one type of monomer, with the understanding that trace amounts of impurities can be incorporated into the polymer structure), and the term interpolymer as defined hereinafter.

The term "interpolymer," as used herein, refers to polymers prepared by the polymerization of at least two different types of monomers. The generic term interpolymer includes copolymers (employed to refer to polymers prepared from two different monomers), and polymers prepared from more than two different types of monomers.

The term "multiple bond" as used herein may refer to either a double bond or a triple bond.

The term "conjugated configuration" as used herein, refers to a configuration of multiple bonds that occurs in a compound, in which two multiple bonds are separated by one single bond, forming an alternating pattern (for example, "double bond-single bond-double bond" or "triple bond-single bond-double bond" or "double bond-single bond-triple bond"). In a conjugated configuration, the multiple bonds may independently be double bonds or triple bonds. More than one alternating pattern may be present in a compound with a conjugated configuration of bonds. Examples of compounds with conjugated bonds are benzene, 1,4-butadiene, furan, acrylonitrile, and acrylic acid.

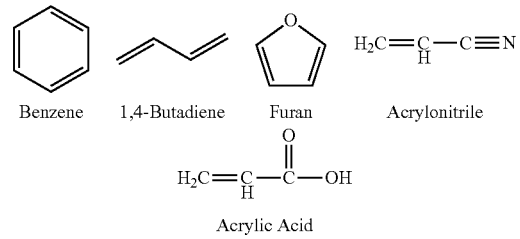

Benzene    1,4-Butadiene    Furan    Acrylonitrile

Acrylic Acid

The term "amine-containing compound" as used herein, refers to an organic compound containing at least one, and preferably one, amine group (for example, primary, secondary or tertiary amine ($NH_2$ or NH or N)).

The term "halide-containing compound," as used herein, refers to an organic compound containing at least one, and preferably one, halide group (for example, Cl, Br, F, and preferably Cl).

The terms "comprising," "including," "having," and their derivatives, are not intended to exclude the presence of any additional component, step or procedure, whether or not the same is specifically disclosed. In order to avoid any doubt, all compositions claimed through use of the term "comprising" may include any additional additive, adjuvant, or compound, whether polymeric or otherwise, unless stated to the contrary. In contrast, the term, "consisting essentially of" excludes from the scope of any succeeding recitation any other component, step, or procedure, excepting those that are not essential to operability. The term "consisting of" excludes any component, step, or procedure not specifically delineated or listed.

Test Methods

GPC

Molecular weights of polymers were determined by gel permeation chromatography (GPC), also referred to as size exclusion chromatography (SEC). The instrument was equipped with a set of columns appropriate for measuring molecular weights in the range of about 500 g/mole to about 1,000,000 g/mole, based on appropriate calibration standards. Particularly effective was a set of three columns, SHODEX KF-801, KF-802.5, and KF-803, 8 mm diameter×300 mm length, available from Thomson Instrument Co., installed in series. The mobile phase was tetrahydrofuran, and it was pumped at a rate of 1.2 mL/min. The instrument was also equipped with a refractive index detector. Calibration was done using poly(methyl methacrylate) standards for Polymer A, and polystyrene standards for Polymer B. Both types of standards are available from Polymer Standards Service GmbH, Mainz, Germany. The Mn, Mw, and MWD were calculated using the "GPC-addon" for ChemStation software, available from Agilent Technologies, Inc.

SEM

Both top-down and cross-section images were measured on a Hitachi CG 4000 SEM (Hitachi High Technologies America, Inc). Top-down measurements are performed on the entire imaged wafer. Cross sections are obtained by cleaving the wafer through the feature of interest, and sputter-coating the wafer piece with a thin layer of either gold or iridium.

Experimental

Materials used in this invention are obtained from commercial sources and used as received. The abbreviation and source of raw materials are as follows:

VTMS: Vinyltrimethoxysilane (Sigma Aldrich, Dow Corning),

MTMS: Methyltrimethoxysilane (Sigma Aldrich, Dow Corning),

PTMS: Phenyltrimethoxysilane (Sigma Aldrich, Dow Corning),

TEOS: Tetraethyl orthosilicate (Sigma Aldrich, Dow Corning),

APTMS: 3-(Acryloxy)propyltrimethoxysilane (Sigma Aldrich, Dow Corning),

OTDA:

9-(4-Oxatricyclo[5.2.1.0 2,6]decane-3-one) acrylate (see below),

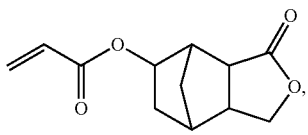 [SMILES: C=CC(=O)OC1CC2CC1C1C(=O)OCC21]

HADA: 3-Hydroxyadamantan-1-yl methacrylate (see below),

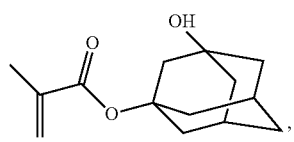 [SMILES: C=C(C)C(=O)OC12CC3CC(CC(O)(C3)C1)C2]

THEIC: Tris[2-(acryloyloxy)ethyl]isocyanurate from Aldrich (see below),

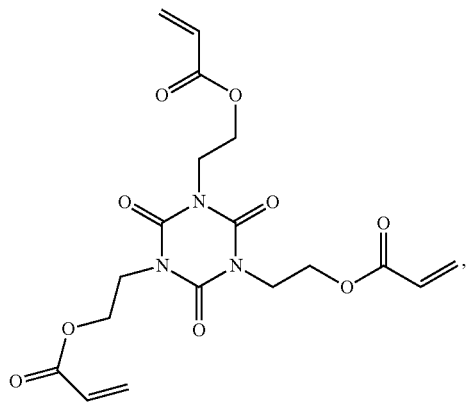 [SMILES: C=CC(=O)OCCn1c(=O)n(CCOC(=O)C=C)c(=O)n(CCOC(=O)C=C)c1=O]

PGMEA: Propylene glycol monomethyl ether acetate (DOWANOL PMA, The Dow Chemical Company), BTEAC: Benzyltriethylammonium chloride (Sigma Aldrich), and 3N Aq. Acetic Acid solution was prepared in the lab. Glacial acetic acid was supplied by JT Baker.

Synthesis of Polymer 1, Homopolymer of APTMS (Polymer A)

First, 30 grams of APTMS was added to 30 grams PGMEA to form a monomer solution. Separately, 1.5 grams of the initiator, V601 (Waco Chemical), was added to 6 grams PGMEA to form an initiator solution. Next, ⅔ of the initiator solution was charged into the reaction flask and de-gassed for 10 minutes. The bath temperature was set at 80° C. The monomer solution was added slowly (use a pump or addition funnel) to the reaction flask over one hour. The reaction was held at 80° C. for three hours, after addition of the monomer was completed. The rest of the initiator solution was then slowly added, and the reaction continued for an additional hour. At the end of the reaction, "21 grams" of PGMEA was added to the reaction flask, which was allowed to cool to room temperature to form a "polymer 1 sol" (polymer A sol). The molecular weight was measured by conventional GPC, Mn was 6139 g/mol, Mw was 21180 g/mol and MWD was 3.45, based on poly(methyl methacrylate) standards.

Synthesis of Polymer 2, Copolymer of APTMS/OTDA/HADA (80/10/10) (Polymer A)

First, 48.5 grams of APTMS, 5.75 grams of OTDA and 5.75 grams of HADA monomers were added to 72.25 grams PGMEA to form a monomer solution. Separately, 3 grams of the initiator, V601 (Waco Chemical), was added to 15 grams PGMEA to form an initiator solution. Next, ⅔ of the initiator solution was charged into the reaction flask and de-gassed for 10 minutes. The bath temperature was set at 80° C. The monomer solution was added slowly (use a pump or addition funnel) to the reaction flask over one hour. The reaction was held at 80° C. for three hours, after addition of the monomer was completed. The rest of the initiator solution was then slowly added, and the reaction continued for an additional hour. At the end of the reaction, 67.75 grams of PGMEA was added to the reaction flask, which was allowed to cool to room temperature to form a "polymer 2 sol." The molecular weight was measured by conventional GPC. The molecular weight was measured by conventional GPC, Mn was 7099 g/mol, Mw was 30283 g/mol and MWD was 4.27.

Synthesis of Polymer 3, Copolymer of APTMS/THEIC (90/10) (Polymer A)

First, 33.31 grams of APTMS, and 6.69 grams of THEIC were added to 85.33 grams cyclohexanone to form a monomer solution. Separately, 2 grams of the initiator, V601 (Waco Chemical), was added to 10 grams cyclohexanone to form an initiator solution. Next, ⅔ of the initiator solution was charged into the reaction flask and de-gassed for 10 minutes. The bath temperature was set at 80° C. The monomer solution was added slowly (use a pump or addition funnel) to the reaction flask over one hour. The reaction was held at 80° C. for three hours, after addition of the monomer was completed. The rest of the initiator solution was then slowly added, and the reaction continued for an additional hour. At the end of the reaction, 34.67 grams of cyclohexanone was added to the reaction flask, which was allowed to cool to room temperature to form a "polymer 3 sol." The molecular weight was measured by conventional GPC, Mn was 9887 g/mol, Mw was 43986 g/mol and MWD was 4.45.

Synthesis of Polymer B

The reaction was run in a 250-ml, 3-neck round-bottom flask, fitted with a short path distillation column and receiving flask and a stir bar. The reaction temperature was monitored using an OMEGA Engineering Temperature Recorder DP470. Heat was applied using an oil bath. Methyltrimethoxysilane (17.49 g), phenyltrimethoxysilane (8.82 g), vinyltrimethoxysilane (10.96 g), and tetraethyl orthosilicate (51.36 g) were weighed, and premixed in 82 g of PGMEA. Acetic acid (3N, 34.21 g) was added to the flask, and stirring was started. The monomer solution was added slowly to the reaction flask using a syringe pump. At one hour from start of monomer addition, the oil bath temperature was set to 100° C. The reaction was held at 100° C. for three hours, after which, the bath temperature was increased to 110° C., and held until the reaction temperature reached 90° C., at which point the heating bath was removed, and the polymer solution allowed to cool. A second aliquot of PGMEA was added to adjust the polymer solution to approximately 20 wt % solids. The solid content of the polymer solution was determined by heating the polymer solution in an oven at 145° C. for one hour.

Forming a Coating Solution: The Composition

Representative Procedure

Polymer 2 sol (Polymer A) was diluted to 1 wt % solids in PGMEA. Afterwards, Polymer B sol and Polymer A sol were mixed according to Table 1, to form different coating solutions. The following was a general procedure that was used to prepare the coating solutions, unless otherwise specified. Malonic acid, at 1 wt %, relative to the total solid, was added to the coating solution; 0.1 wt % BTEAC, relative to the total solid, was added to the coating solution; finally, PGMEA was added to balance the formulation to 2 wt % total solids. A commercial organic BARC product, AR26N (available from The Dow Chemical) was used without modification, as a comparative solution coating.

TABLE 1

| | Compositions | | | |
|---|---|---|---|---|
| | Blend ratio (wt) | | | |
| | Polymer A | | | |
| | Polymer 1 | Polymer 2 | Polymer 3 | Polymer B |
| Composition 1 | 6 | | | 94 |
| Composition 2 | | 10 | | 90 |
| Composition 3 | | | 10 | 90 |
| Composition 4 | 10 | | | 90 |
| Composition 5 | 3 | | | 97 |
| Composition 6 | | 6 | | 94 |
| Composition 7 | 90 | | | 10 |
| Composition 8 | 0 | | | 100 |
| Composition 9 | 100 | | | 0 |

Formation of the Single Layer Coatings (Inventive Composition)

In a clean-room environment (about 72° F., about 50% RH, class 100), unprimed "200 mm" diameter silicon wafers, from WaferNet Inc., were used as substrates. Onto a Si wafer, a composition (as described in Table 1, plus malonic acid, BTEAC and PGMEA) was hand dispensed, and spin coated to a nominal film thickness of 35 nm (measured on a THERMA-WAVE spectroscopic ellipsometer), on a Tokyo Electron (TEL) ACT-8 coat track. The coating was soft-baked at 240° C., for 60 seconds, to form a SiARC coating.

Measurement of Optical Properties (n, k at 193 nm) and Film Thickness

The optical properties and thickness of the single layer coatings were measured using a WOOLAM VUV-VASE VU-302 ellipsometer (Woolam, Nebr.). Polarization data was collected at three angles over a range of wavelengths from 170 nm to 900 nm. The data was automatically generated, to obtain the thickness of the coating and the refractive index (n, k) at 193 nm, where n is the real part of the complex refractive index and k is the imaginary part of the complex refractive index. Results are shown in Table 2.

Measurement of Water Contact Angle

Single layer coatings, as discussed above, were analyzed "as-received" within one hour of coating. A DATAPHYSICS Instruments GmBH, model OCA20, goniometer was used for all contact angle measurements. Deionized water was used as the test liquid. A one microliter drop was used for each contact angle determination. After the drop was dispensed on the surface of the single layer coating, the goniometer needle was withdrawn leaving behind the deposited drop. The drop motion was recorded for a minimum of ten seconds (for each measurement) using the goniometer camera, at a minimum rate of three frames/second. The first drop image, when the needle had been completely removed from the field of view, and no drop motion was present, was used to determine the contact angle. The contact angle was evaluated using a circular model in the OCA software. A minimum of three measurements were taken across the single layer coating, using a linear translation of the stage, and spacing each drop approximately 0.5-0.75 cm apart (three drops per single layer coating). Typical standard deviations for contact angle measurements are typically 0.2 degrees, but preferably less than 0.1 degrees. Results are shown in Table 2 (CA refers to "contact angle").

Measurement of Solvent Resistance

The solvent resistance was evaluated using the following procedure. First, the initial film thickness of the single layer film was measured on a THERMA-WAVE. The coating was then applied using a Tokyo Electron (TEL) ACT-8 coat track.

PGMEA was dispensed on wafer and kept for 90 seconds. Afterwards, the wafer was spin dry for 30 seconds at 3000 rpm, and baked at 110° C./60 s. The thickness of the dried coating was measured on THERMA-WAVE, as discussed above. The solvent resistance was characterized by the percentage of change in thickness.

Formation of the ArF Negative Tone Development (NTD) Photoresist

A suitable negative tone development photoresist is formed from the following mixture:
28.95 g propylene glycol methyl ether acetate,
19.30 g cyclohexanone,
48.25 g hydroxybutyrate methyl ester,
2.89 g copolymer of (2,2-dimethyl-1,3-dioxolan-4-yl)methyl methacrylate, 5-(2,2-dimethyl-1,3-dioxolan-4-yl)-2,2-dimethyltetrahydrofuro[2,3-d][1,3]dioxol-6-yl methacrylate, methyl-adamantly methacrylate/5-oxo-4-oxa-tricyclonon-2-yloxycarbonylmethyl methacrylate, hydroxyadamantyl acrylate with a mole ratio of 25/25/40/10, respectively, and weight average molecular weight of 22,000,
0.49 g triphenylsulfonium 1,1,2,2-tetrafluoro-4-((4-(13-methyl-3,7,12-trioxohexadecahydro-1H-cyclopenta[a]phenanthren-17-yl)pentanoyl)oxylbutane-1-sulfonate,
0.07 g polymer of n-butyl methacrylate with a weight average molecular weight of 10,000,
0.05 g dodecyldiethanolamine, and
0.01 g PolyFox 656 fluorinated surface leveling agent.

Formation of the Bi Layer Coatings

First, the single coatings of the compositions (see Table 1, plus malonic acid, BTEAC and PGMEA) were coated, as described in the formation of the single layer coating section. The ArF PTD Photoresist was applied over the single layer coating by spin coating, and the coated wafer was soft baked at 100° C. for 60 seconds, to achieve a photoresist film thickness of 100 nm (as measured on a THERMA-WAVE spectroscopic ellipsometer).

Evaluation of the Adhesion of Bi Layer Coatings

After bi layer coatings were formed, the adhesion test was carried out. The adhesion test used tape pull with reference to ASTM D3359. The wafer piece was first immersed in 2-heptanone solution for 10 minutes, rinsed with deionized water, and blown dry with nitrogen. A piece of Scotch tape (3M, MN) was firmly pressed on the ArF photoresist coating. The length of the adhered section was one inch, and the remaining connecting free section was at least one inch. The free section of the tape was gripped by two fingers and pulled back quickly at an angle against the coating surface of about 270°. After the tape pull, the remained coating was visually examined, and the area of the coating that was transferred to the tape was estimated as a percentage of the surface area of the tape that was adhered to the coating. A "0% peel" represented good adhesion, while a "100% peel" indicated adhesion failure. The results are shown in Table 2.

The coating for pattern lithography needs to have good interlayer adhesion. If the adhesion is weak, delamination can occur during the lithography, or pattern collapse can occur when the adhesive force is less than the different types of forces, such as residual forces, thermal stress, solvent swelling stress and capillary force.

Formation of the Tri Layer Coatings

The inventive layer is used in a trilayer scheme to examine the lithographic performance. The general structure of the trilayer is shown in FIG. 1.

Formation of the Under Layer

An organic poly(methacrylate)-based underlayer coating composition (AR26N, available from the Dow Chemical Company) was applied to a silicon wafer by spin coating, and the coated wafer was baked at 240° C. for 60 seconds to achieve a film thickness of 135 nm.

Formation of the Inventive Layer (Inventive Composition) on the Under Layer

Each inventive coating composition, described in Table 1 (plus malonic acid, BTEAC and PGMEA), was applied to the underlayer-coated wafer from the previous step, by spin coating, and a baked at 240° C., for 60 seconds, to achieve a film thickness of 35 nm (thickness of inventive layer).

Formation of the Trilayer

ArF Photoresist (NTD as described previously) was applied to the coated wafers from the previous step, by spin coating, and the coated wafer was soft baked at 100° C., for 60 seconds, to achieve a photoresist film thickness of 100 nm.

Formation of Lithographic Pattern

Lithographic Processing

The formed trilayer coatings were processed according to the following steps:
1) Exposure: the applied photoresist layer was exposed to patterned "193 nm" radiation, using an ASML 1900i;
2) Post-Exposure Bake: 120° C./60 seconds;
3) Development: the latent image was developed with a suitable organic solvent (such as OSD1000 from Dow Chemical Company).

Evaluation of the Lithographic Performance of Trilayer Coatings

One aspect of photoresist performance is photo speed. Photo speed shift, relative to a reference material, was measured by running a contrast curve, using an ASML instrument (model PAS5500/1100). Each tri-layer coating, as discussed above, was subjected to increasing levels of radiation (ArF laser, 193 nm). The contrast curve began at a dose of "1 mJ/cm$^2$," and increased by "0.1 mJ/cm$^2$" increments, to a final dose of "10.9 mJ/cm$^2$." There was a total of 100 exposures, run in a serpentine pattern starting in the lower left corner of the coated wafer. After exposure, the tri-layer was developed with OSD1000. The film thickness of the resist was measured by a THERMA-WAVE OPTIPROBE. The dose, at which greater than 50% of the resist film remained, was designated as $E_{100}$. A lower value of $E_{100}$ would correspond to a faster photo speed. In this study, a reference antireflective coating, organic antireflective coating, AR 26N (Dow Chemical Company), was used. The $E_{100}$ of the reference material was measured. The relative photo speed shift was defined as: $(E_{100,r}-E_{100,s})/E_{100,r}*100$, where $E_{100,r}$ was the $E_{100}$ for AR26N and $E_{100,s}$ was that of the inventive coating. It is desired that an inventive antireflective hardmask (inventive coating) have a similar photo speed (or a smaller photo speed shift) compared to the reference material. Results are shown in Table 2.

Figure 2:
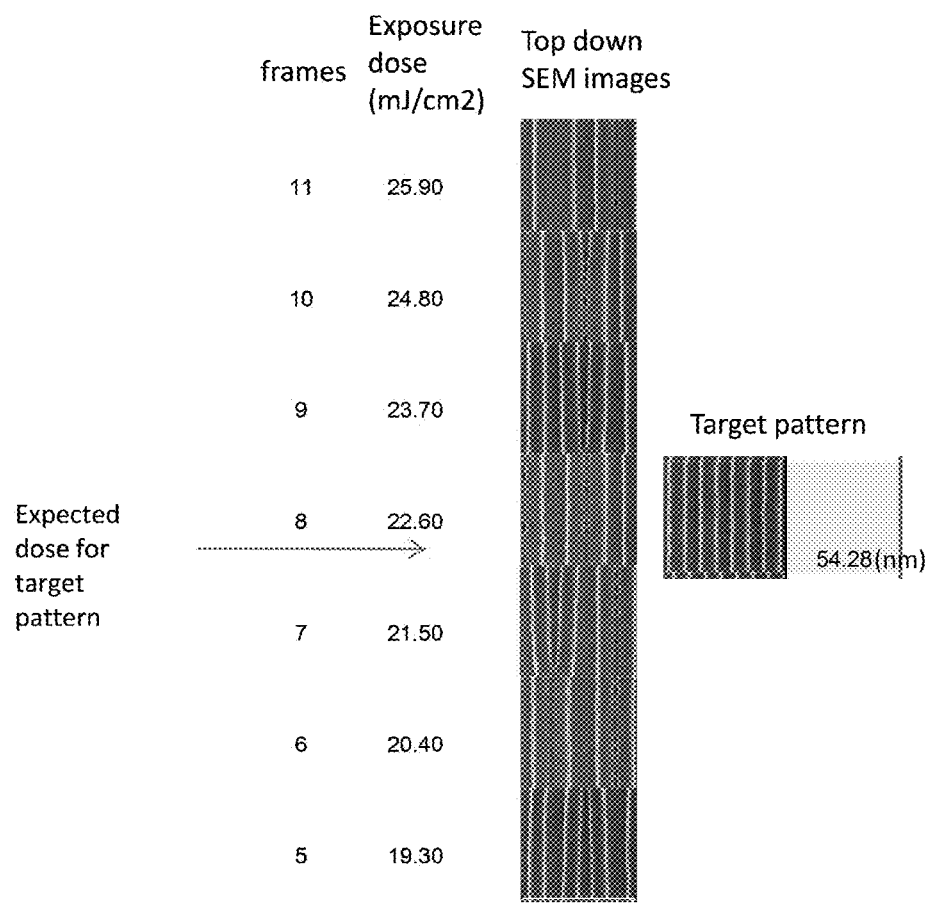
FIG. 2 depicts "top-down" SEM images of wafer surfaces after a lithography process illustrating a complete pattern collapse.
Figure 3:
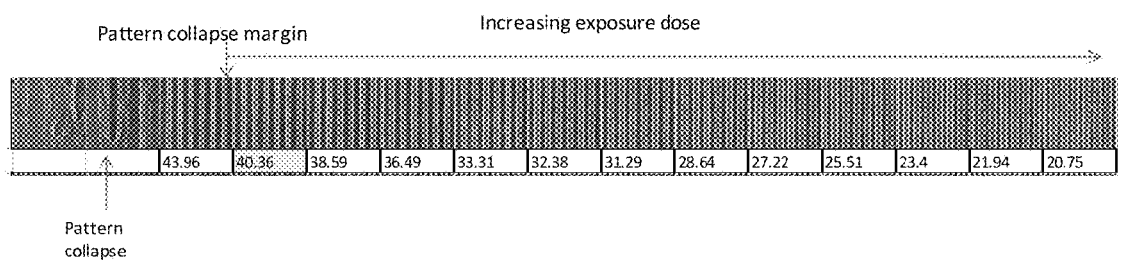
FIG. 3 is a "top-down" SEM image of a wafer surface after a lithography process illustrating a pattern collapse margin.

Another aspect of photoresist performance is the pattern collapse margin. It is desirable to obtain very small line-space patterns, while preventing, or reducing, the "fall over" or collapse of such small line-space patterns. Hardmask compositions that do not provide adequate adhesion to the photoresist can result in pattern collapse, as shown in the "top-down SEM images" in FIG. 2. FIG. 3 illustrates the quantitative definition of "pattern collapse margin." The numbers in this figure are the width of the trench in an "80 nm pitch pattern." The higher the pattern collapse margin, the narrower the width of the standing lines, and thus the better the lithographic performance, in terms of the minimum dimension that can be formed. Results are shown in Table 2 (PCM refers to "Pattern Collapse Margin").

As discussed above, Table 2 summarizes different properties of the inventive and comparative examples. According to Table 2, all six inventive examples had good adhesion (less than 10% removal). In comparison, the Comparative Example 1, which comprised only the polymer B, had more than 50% of removal, suggesting poor adhesion between SiARC and photoresist. Table 2 shows that the inventive example had better lithographic performance than comparative examples. Example 1 had higher Pattern Collapse Margin (PCM) than Comparative Examples 1 and 3. Table 2 also shows that inventive example had better solvent resistant. The Examples 2, 5 and 6 had lower thickness changes after exposed to solvent, while Comparative Example 2 had a 14% change in thickness (or 14% swelling), which would cause lithographic failure. Further these inventive examples had desired photo speed. It is preferred to have the photo speed within 20% of the reference material. Example 7 had a photo speed that was 39% faster than the reference material, which could narrow the process window of this sample. See Table 2.

Although the invention has been described in considerable detail in the preceding examples, this detail is for the purpose of illustration, and is not to be construed as a limitation on the invention, as described in the following claims.

TABLE 2

Properties of Inventive and Comparative Examples

|  | Composition | Contact Angle | Solvent resistance % of thickness change | n193 | k193 | Wet Adhesion % Peel % of removal | Photo speed shift (%) | PCM nm |
|---|---|---|---|---|---|---|---|---|
| Example 1 | Composition 1 | 75 |  | 1.672 | 0.205 | 0 | 5 | 44.7 |
| Example 2 | Composition 2 |  | −0.1 |  |  | <5 |  |  |
| Example 3 | Composition 3 | 75 |  |  |  | <5 |  |  |
| Example 4 | Composition 4 |  |  |  |  | 0 | 17 |  |
| Example 5 | Composition 5 | 76 | −0.2 | 1.675 | 0.196 | <5 | 5 |  |
| Example 6 | Composition 6 | 76 | 0.1 | 1.679 | 0.201 | <10 |  |  |
| Example-7 | Composition 7 |  |  |  |  |  | 39 |  |
| Comparative Example 1 | Composition 8 | 77 |  | 1.68 | 0.2 | >50 |  | 37.6 |
| Comparative Example 2 | Composition 9 |  | 14 |  |  |  |  |  |
| Comparative Example 3 | AR 26N | 58 |  |  |  | 0 | 0 | 40.2 |

The invention claimed is:

1. A composition comprising at least the following A and B:

A) polymer that comprises the following structural unit 1:

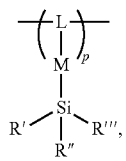

(1)

wherein
L is CX—CYZ, where X, Y, and Z are each independently selected from hydrogen, an alkyl, or a substituted alkyl; and,
M is an alkylene, an arylene, a substituted alkylene, a substituted arylene, or C(O)O—W—, where W is an alkylene or a substituted alkylene; and
R', R", and R''' are each independently selected from an aromatic hydrocarbon, an aliphatic hydrocarbon, or a substituted hydrocarbon that comprises one or more of O, N, S, or Si atoms, provided that at least one of R', R", and R''' is selected from alkoxyl, aryloxyl, hydroxyl, halide, carboxyl, or carbonate; and,
p is an integer from 1 to 10,000; and with the proviso that the polymer does not comprise a polyhedral oligomeric silsesquioxane (POSS) structure; and B) a polymer formed from a first composition comprising at least one of the following:
a) a Compound F1 selected from Formula 1:

(Formula 1)

wherein Ra comprises one or more multiple bonds, provided that, if Ra comprises more than one multiple bond, these multiple bonds are not in a conjugated configuration; and
R1, R2, and R3 are each independently selected from alkoxyl, hydroxyl, halide, OC(O)R, or OC(O)OR, wherein R is alkyl or a substituted alkyl;

b) a Compound F2 selected from Formula 2:

(Formula 2)

wherein Rb is selected from H or a saturated group comprising alkyl, alkylene, or alkylidene; and R4, R5, and R6 are each independently selected from alkoxyl, hydroxyl, halide, OC(O)R, or OC(O)OR, wherein R is alkyl or a substituted alkyl;

c) a Compound F3 selected from Formula 3:

(Formula 3)

wherein Rc comprises more than one multiple bond, and these multiple bonds are in a conjugated configuration; and R7, R8, and R9 are each independently selected from alkoxyl, hydroxyl, halide, OC(O)R, or OC(O)OR, wherein R is alkyl or a substituted alkyl; and/or d) A Compound F4 selected from Formula 4:

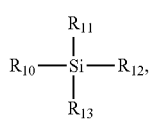

(Formula 4)

wherein R10, R11, R12, and R13 are each independently selected from alkoxyl, hydroxyl, halide, OC(O)R, or OC(O)OR, wherein R is alkyl or a substituted alkyl; and
wherein the first composition comprises Compounds F1, F2, F3 and F4, and wherein the molar ratio of F1/F4 is from 1/20 to 1/1.

2. The composition of claim 1, wherein in structural unit (1), X, Y, and Z are each independently selected from hydrogen or a C1-C10 alkyl group.

3. The composition of claim 1, wherein, in structural unit (1), M is a C1 to C10 alkylene, a C1 to C10 arylene, or a C(O)O—W—, and W is a C1 to C10 alkylene group.

4. The composition of claim 1, wherein, in structural unit (1), R', R", and R''' are each independently selected from a C1 to C10 aliphatic hydrocarbon, a C1 to C10 aromatic hydrocarbon, OH, OR, OC(O)R, or OC(O)OR, where R is a C1 to C10 aliphatic hydrocarbon, or a C1 to C10 aromatic hydrocarbon, provided that at least one of R', R", and R''' is OH, OR, OC(O)R, or OC(O)OR.

5. The composition of claims 1, wherein, in structural unit (1), X, Y, and Z are each independently selected from hydrogen, or a C1 to C10 alkyl group; and
M is a C1 to C10 alkylene, a C1 to C10 arylene, or a C(O)O—W—, and W is a C1 to C10 alkylene group; and
R', R", and R''' are each independently selected from a C1 to C10 aliphatic hydrocarbon, a C1 to C10 aromatic hydrocarbon, OH, OR, OC(O)R, or OC(O)OR, where R is a C1 to C10 aliphatic hydrocarbon, or a C1 to C10 aromatic hydrocarbon, provided that at least one of R', R", and R''' is OH, OR, OC(O)R, or OC(O)OR; and
p is an integer from 10 to 1000.

6. The composition of claims 1, wherein, in structural unit (1), X, Y, and Z are each independently selected from hydrogen or a methyl group; and
M is phenylene or C(O)O—W—, and W is a C1 to C4 alkylene group; and
R', R", and R''' are each independently selected from OH, OR, OC(O)R, or OC(O)OR, where R is a methyl, ethyl, n-propyl, 2-propyl, n-butyl, isobutyl, or 2-butyl; and
p is an integer from 10 to 500.

7. The composition of claim 1, wherein structural unit (1) has the following structure:

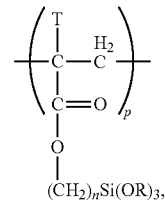

where T is H or methyl; R is methyl or ethyl; n is an integer from 1 to 3; and p is an integer from 10 to 500.

8. The composition of claim 1, wherein structural unit (1) is poly(3-acryloxypropyltrimethoxysilane).

9. The composition of claim 1, wherein the polymer of component A has an Mw from about 10,000 to about 100,000.

10. The composition of claim 1, wherein the first composition comprises greater than, or equal to, 5 weight percent Si, based on the sum weight of Compounds F1, F2, F3 and F4.

11. The composition of claim 1, wherein the sum molar amount of Compound F2 and Compound F4 is greater than, or equal to, 40 mole percent, based on the sum moles of Compounds F1, F2, F3 and F4.

12. The composition of claim 1, wherein Compound F4 is present in an amount greater than 10 mole percent, based on the sum moles of Compounds F1, F2, F3 and F4.

13. An article comprising at least one component formed from the composition of claim 1.

14. A film comprising at least one layer formed from the composition of claims 1.

15. A method of forming a coating on a substrate, said method comprising at least the following: providing a substrate,
forming an underlayer on the substrate, wherein the underlayer comprises at least one polymer,
applying the composition of any of claim 1 over the underlayer, and
curing the composition to form the coating.

16. The composition of Claim 1, wherein the first composition comprises Compound F1 in an amount greater than 10 mole percent, based on the sum moles of F1, F2, F3 and F4.

17. the composition of Claim 1, wherein the first composition comprises Compound F4 in an amount from 10 to 65 mole percent, based on the sum moles of Compounds F1, F2, F3 and F4.

* * * * *